United States Patent [19]
Mochizuki et al.

[11] Patent Number: 5,830,949
[45] Date of Patent: Nov. 3, 1998

[54] ADHESIVE RESIN COMPOSITION AND ADHESIVE SHEET

[75] Inventors: Amane Mochizuki; Michie Sakamoto; Masahiro Yoshioka; Yuji Hotta, all of Osaka, Japan

[73] Assignee: Nitto Denko Corporation, Osaka, Japan

[21] Appl. No.: 934,398

[22] Filed: Sep. 19, 1997

[30] Foreign Application Priority Data

Sep. 26, 1996 [JP] Japan .................................. 8-277212

[51] Int. Cl.⁶ .......................... C08G 18/02; C08G 73/10; C09J 179/08; B32B 7/12
[52] U.S. Cl. ........................... 525/452; 528/74; 528/310; 528/312; 528/322; 428/355 N; 428/355 CN
[58] Field of Search ............... 525/452; 528/74, 528/310, 312, 322; 428/355 R, 355 N, 355 CN

[56] References Cited

U.S. PATENT DOCUMENTS

| | | | |
|---|---|---|---|
| 4,148,844 | 4/1979 | Von Bonin et al. | 525/452 |
| 4,412,884 | 11/1983 | Scola | 156/307.3 |
| 5,393,839 | 2/1995 | Iwamoto | 525/452 |
| 5,663,257 | 9/1997 | Futaesaku et al. | 526/262 |

FOREIGN PATENT DOCUMENTS

| | | | |
|---|---|---|---|
| 0461466 | 12/1991 | European Pat. Off. | |
| 2847481 | 5/1980 | Germany | 525/452 |

*Primary Examiner*—Peter A. Szekely
*Attorney, Agent, or Firm*—Sughrue, Mion, Zinn, Macpeak & Seas, PLLC

[57] ABSTRACT

An adhesive resin composition comprising a polycarbodiimde resin and a bisalkenyl-substituted nadimide and an adhesive sheet using the resin composition.

The adhesive resin composition can adhere in a short time even at low temperature, has a high heat resistance, has a low hygroscopic property, and is hard to cause package crackings, etc.

9 Claims, No Drawings

ADHESIVE RESIN COMPOSITION AND ADHESIVE SHEET

FIELD OF THE INVENTION

The present invention relates to a novel adhesive resin composition for electronic parts and an adhesive sheet using the adhesive resin composition as the main component.

BACKGROUND OF THE INVENTION

A pasty adhesive and a heat resistant substrate coated with an adhesive have hitherto been known as adhesives for a fixing treatment of electric and electronic parts, such as semiconductor chips, substrates, or lead frames. The adhesives used in these cases include thermosetting resin series adhesives such as epoxy resin series adhesives, acrylic resins series adhesives, or rubber-phenol resin series adhesives.

However, because these adhesives require high temperature and a long time for heat setting, they are poor in the adhesive workability. Also, these adhesive have various disadvantages that not only a large amount of volatile components generate at heat setting to stain, for example, lead frames, but also the hygroscopic property is high, and cracks form at reflowing of a solder.

As described above, it is hard to say that conventional adhesives for fixing electric and electronic parts have a high reliability necessary for the electric and electronic parts and sufficiently satisfactory adhesives have not yet been obtained.

In the meantime, a hot-melt type film adhesive using a thermoplastic polyimide resin can heat-adhere to an adherend in a short time. For such adhesives, heat setting after adhering is not necessary but high temperature is required for working due to the high glass transition temperature of these adhesives. Thus there is a large possibility of giving a thermal damage to the adherend. On the other hand, in the case of using an adhesive having a low glass transition temperature, the adhesive is excellent in the low-temperature workability but because the heat resistance of such an adhesive is low, the reliability is greatly lowered.

Furthermore, because these thermoplastic polyimide resins have a high hygroscopic property, complicated processes such as the removal of absorbed moisture by pre-drying the resins before adhering are required, and thus the productivity thereof is low.

JP-A-62-1714, JP-A-5-239427, and JP-A-5-320611 (the "JP-A" as used herein means an "unexamined published Japanese patent application") describe adhesive resin compositions wherein in order to improve the workability as described above, a polycarbodiimide resin is blended with an epoxy resin having a relatively low molecular weight to improve the flowability thereof. However, in these compositions, there are problems about the storage stability and the hygroscopic property due to the epoxy resin and satisfactory results are not obtained.

SUMMARY OF THE INVENTION

As a result of various investigations on adhesive resin compositions which can adhere in a short time even at low temperature, have a high heat resistance, have a low hygroscopic property, and are hard to cause package cracks, the present inventors have found that a resin composition comprising a polycarbodiimide resin and a bisalkenyl-substituted nadimide satisfies these requirements, and have accomplished the present invention.

Accordingly, one object of the present invention is to provide an adhesive resin composition having excellent various properties.

Another object of the present invention is to provide an adhesive sheet using the adhesive resin composition.

According one embodiment of the present invention, there is provided an adhesive resin composition comprising a polycarbodiimide resin represented by following formula (1) and a bisalkenyl-substituted nadimide represented by following formula (2):

wherein A represents a divalent organic group and n represents a positive integer,

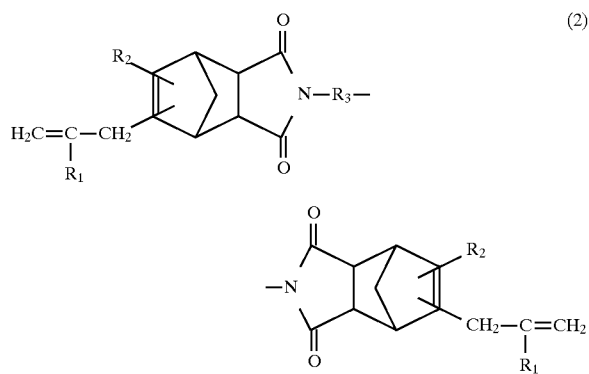

wherein $R_1$ and $R_2$ each independently represents a hydrogen atom or a methyl group and $R_3$ represents a diamine residue.

According to another embodiment of the present invention, there is provided an adhesive sheet comprising the above-described adhesive resin composition as the main component.

According to still another embodiment of the present invention, there is provided an adhesive sheet comprising a support having formed on at least one surface thereof the above-described adhesive resin composition.

JP-A-7-286140, JP-A-7-258353. and JP-A-7-330872 describe resin compositions wherein the bisalkenyl-substituted nadimide, which is the essential component in the present invention, is blended with, for example, a thermosetting coating material having excellent heat resistance, bismaleimide, or an epoxy resin. However, there is no description in those patent publications that by compounding the bisalkenyl-substituted nadimide, the hygroscopic property and the storage stability are improved and also about such adhesives, satisfactory results are not obtained in the points of the adhesive property and the flexibility.

DETAILED DESCRIPTION OF THE INVENTION

The present invention is described in more detail below.

There is no particular restriction on the degree of polymerization (n) of the polycarbodiimide resin which is the one component of the adhesive resin composition of the present invention, but the degree of polymerization is preferably from 2 to 200, and more preferably from 8 to 40. Also, there is no particular restriction on the compounding ratio of the bisalkenyl-substituted nadimide compound, which is another component of the composition of the present invention, to the polycarbodiimide resin, and the compounding ratio is determined by considering the workability and the adhesive property of the adhesive sheet of the present invention. The compounding amount of the bisalkenyl-substituted nadimide compound is from 1 to 100 parts by weight, preferably from 5 to 80 parts by weight, and more preferably from 10 to 60 parts by weight, per 100 parts by weight of the polycarbodiimide resin. If the compounding amount of the bisalkenyl-substituted nadimide compound is less than 1 part by weight, the addition effect of the bisalkenyl-substituted nadimide compound is not obtained. On the other hand, if the compounding amount of the bisalkenyl-substituted nadimide compound exceeds 100 parts by weight, the strength of the adhesive sheet is lowered, which is not preferred.

(A) Polycarbodiimide Resin

The polycarbodiimide resin used in the present invention can be produced by a conventional method. For example, the polycarbodiimide resin can be obtained by reacting an organic diisocyanate in an organic solvent in the presence of a carbodiimidation catalyst as disclosed in L. M. Alberino et al., *Journal of Applied Polymer Science*, 21, 1999 (1977), JP-A-2-292316, and JP-A-4-276359.

The organic diisocyanate used in the above reaction for obtaining the polycarbodiimide resin includes aromatic diisocyanates such as 2,4-tolylene diisocyanate, 2,6-tolylene diisocyanate, 1-methoxyphenyl-2,4-diisocynate, 4,4'-diphenylmethane diisocyanate, 3,3'-dimethoxy-4,4'-diphenylmethane diisocyanate, 3,3'-dimethyl-4,4'-diphenylmethane diisocynate, 4,4'-diphenyl ether diisocyanate, 3,3'-dimethyl-4,4'-diphenyl ether diisocyanate, or o-tolylene diisocyanate; and aliphatic diisocyanates such as 4,4-methylenebis(cyclohexyl isocyanate), bis(isocyanate methyl)cyclohexane, isophorone diisocyanate, cyclohexylene diisocyanate, adamantylene diisocyanate, hexamethylene diisocyanate, p-xylene diisocyanate, m-xylylene diisocyanate, or octamethylene diisocyanate.

Those can be used alone or as a mixture of two or more thereof (a copolymer is obtained).

Furthermore, the organic diisocyanate produced from a diamine by the following conventional method can be used. That is, there are, for example, a method of reacting the corresponding diamine with phosgene, diphenyl carbonate, and carbonyl diimidazole; and a method of producing an organic diisocyanate from a dicarboxylic acid by a Curtius rearrangement. Also, the organic diisocyanate may be produced by a method of producing the diisocyanate by the thermal decomposition of the corresponding urethane, etc., as described in G. Greber, et al., *Angew. Int. Ed.,* Vol. 7, No. 12, 941 (1968) and V. L. K. Valli, et al., *Journal of Organic Chemistry*, Vol. 60, 257 (1995).

Aromatic diamines are suitably used as the starting diamines for producing such diisocyanates.

Examples of the aromatic diamines are 2,2'-bis[4-(4-aminophenoxyphenyl)]propane, 2,2'-bis[4-(4-aminophenoxyphenyl)]-hexafluoropropane, 1,3-bis(4-aminophenoxy)benzene, 1,4-bis(4-aminophenoxy)benzene, 2,4-diaminotoluene, 2,6-diaminotoluene, diaminodiphenylmethane, 4,4'-diamino-2,2'-dimethyl, and bis(trifluoro)biphenyl, although the diamines are not limited to these compounds.

These organic diisocyanates can be used alone or as copolymers of the mixtures of two or more kinds of them.

A solvent used for the production of the above-described diisocyanates can be conventional solvents for these reactions. Examples of the solvent which can be used are halogenated hydrocarbon series solvents such as tetrachloroethylene, 1,2-dichloroethane, or chloroform; ketone series solvents such as acetone, methyl ethyl ketone, methyl isobutyl ketone, or cyclohexanone; cyclic ether series solvents such as tetrahydrofuran, or dioxane; or the mixtures thereof.

The carbodiimidation catalyst which can be used for producing the polycarbodiimide resin in the present invention is phosphorene oxides, and examples thereof include 3-methyl-1-phenyl- 2-phosphorene-1-oxide, 1-phenyl-2-phosphorene-1-oxide, 3-methyl-2-phosphorene-1-oxide, 1-ethyl-2-phosphorene-1-oxide, 1-methyl-2-phosphorene-1-oxide, and 3-phosphorene isomers thereof.

(B) Bisalkenyl-substituted Nadimide

The conventional bisalkenyl-substituted nadimides described in JP-A-59-80662, JP-A-60-178862, JP-A-61-18761, and JP-A-63-170358 can be used as the bisalkenyl-substituted nadimide which is another indispensable component for the adhesive resin composition of the present invention. The bisalkenyl-substituted nadimide can be generally produced by the reaction of the corresponding alkenyl-substituted nadic acid anhydride and a diamine.

The bisalkenyl-substituted nadimides include bisallyl-substituted nadimides such as N,N'-ethylene-bis(allylbicyclo[2,2,1]hepto-5-ene-2,3-dicarboxyimide), N,N'-trimethylene-bis(allylbicyclo[2,2,1]hepto-5-ene-2,3-dicarobxyimide), N,N'-hexamethylene-bis(allylbicyclo[2,2,1]hepto-5-ene-2,3-dicarboxyimide, or N,N'-dodecamthylene-bis(allylbicyclo[2,2,1]hepto-5-ene-2,3-dicarboxyimide), wherein the diamine is an aliphatic diamine.

Other bisalkenyl-substituted nadimides include N,N'-p-phenylene-bis(allylbicyclo[2,2,1]hepto-5-ene-2,3-dicarboxyimide), N,N'-m-phenylene-bis(allylbicyclo[2,2,1] hepto-5-ene 2,3-dicarboxyimide), bis{4-(allylbicyclo[2,2,1] hepto-5-ene-2,3-dicarboxyimide)phenyl}methane, and bis{4-(allylbicyclo[2,2,1]hepto-5-ene-2,3-dicarboxyimide) phenyl}ether, wherein the diamine is an aromatic diamine, and also include N,N'-p-xylylene-bis(allylbicyclo[2,2,1] hepto-5-ene-2,3-dicarboxyimide), and N,N'-m-phenylene-bis(allylbicyclo[2,2,1]hepto-5-ene-2,3-dicarboxyimide), wherein the diamine is a phenylenealkylene-diamine.

These bisalkenyl-substituted nadimides can be used alone or as a mixture thereof.

(Curing catalyst)

To shorten the setting time of the adhesive resin composition of the present invention, a curing catalyst for the polycarbodiimide resin and the bisalkenyl-substituted nadimide can be used together. The amount of the curing catalyst used is from 0.01 to 30 parts by weight, and preferably from 0.5 to 5 parts by weight, per 100 parts by weight of the sum of both the resins.

The curing catalyst includes organic peroxides, onium salts, cationic catalysts, and organic group-containing metal compounds.

(i) Organic peroxides include di-t-butyl peroxide, di-t-amyl peroxide, t-butylcumyl peroxide, diacetyl peroxide, dipropionyl peroxide, di-iso-butyryl peroxide, benzoyl peroxide, peroxysuccinic acid, t-butyl hydroperoxide, cyclohexyl hydroperoxide, cumene hydroperoxide, t-butylperoxy benzoate, t-butylperoxy pivalate, 1,1-di-t-butylperoxycyclohexane, di(t-butylperoxy) isophthalate, t-butylperoxy maleate, t-butylperoxyisopropyl carbonate, and 2-di-t-butylperoxybutane.

(ii) Onium salts include ammonium compounds, phosphonium compounds, arsonium compounds, stibonium compounds, oxonium compounds, sulfonium compounds, selenonium compounds, stannonium compounds, and iodonium compounds.

Examples of the ammonium compounds include benzyltriethylammonium chloride, benzyltriethylammonium bromide, phenyltrimethylammoniumbromide, tetra-n-butylammonium chloride, tetra-n-butylammoniumperchloride, tetraethylammonium tetrafluoroborate, m-trifluoromethylphenyltrimethylammonium bromide, and tetra-n-butylammoniumtrifluoromethane sulfonate.

The phosphonium compounds include methyltriphenylphosphonium iodide, methyltriphenylphosphonium bromide, benzyltriphenylphosphonium chloride, tetraphenylphosphonium bromide, and 3-bromopropyltriphenylphosphonium bromide.

The arsonium compounds include benzyltriphenylarsonium chloride, tetraphenylarsonium bromide, and tetra-n-butylarsonium chloride.

The stibonium compounds include benzyltriphenylstibonium chloride, and tetraphenylstibonium bromide.

The oxonium compounds include triphenyloxonium chloride, and triphenyloxonium bromide.

The sulfonium compounds include triphenylsulfonium tetrafluoroborate, triphenylsulfonium hexafluoroarsenate, tri(p-methoxyphnyl)sulfonium hexafluorophosphate, tri(p-tolyl)sulfonium tetrafluoroborate, dimethylphenacylsulfonium hexafluorophosphate, and dimethylphenacylsulfonium tetrafluoroborate.

The selenonium compounds include triphenylselenonium tetrafluoroborate, triphenylselenonium hexafluoroarsenate, triphenylselenonium fluoroantimonate, and p-(t-butylphenyl)diphenylselenoniun hexafluoroarsenate.

The stannonium compounds include triphenylstannonium chloride, triphenylstannonium bromide, tri-n-butylstannonium bromide, or benzylphenylstannonium chloride.

The iodonium compounds include diphenyliodonium chloride, diphenyliodonium bromide, diphenyliodonium perchloride, diphenyliodonium tetrafluoroborate, iodonium hexafluoroarsenate, iodonium hexafluorophosphate, iodonium hexafluoroantimonate, (p-methoxyphenyl)phenyliodonium tetrafluoroborate, di(2-nitrophenyl)iodonium hexafluoroarsenate, di(p-tolyl)iodonium hexafluorophosphate, and di(p-chlorophenyl)iodonium hexafluoroarsenate.

(iii) The cationic catalysts used as the curing catalyst in the present invention include acids or Brϕnsted acids liberating acids, such as sulfuric acid, dimethyl sulfate, diethyl sulfate, pyridine sulfate, phosphoric acid, phosphorous acid, phenylphosphonic acid, phenylphosphinic acid, triethyl phosphate, dimethyl phosphate, phenyl phosphite, methanesulfonic acid, trifluoromethanesulfonic acid, m-xylene-4-sulfonic acid, p-xylene-2-sulfonic acid, benzenesulfonic acid, p-toluenesulfonic acid, a p-toluenesulfonic acid•triphenylamine complex, a p-toluenesulfonic acid•nitrobenzenesulfonic acid•pyridine complex, naphthalene sulfonic acid, methyl benzenesulfonate, or ethyl p-toluenesulfonate, or the esters and amine complexes thereof; and halides showing a Lewis acid property or the complexes of the bases thereof, such as boron trichloride, boron trifluoride, a boron trifluoride•ether complex, iron trichloride, tin tetrachloride, titanium tetrachloride, aluminum chloride, an aluminum chloride•pyridine complex, aluminum bromide, zinc chloride, or antimony pentachloride.

(iv) The organic group-containing metal compounds used as the curing catalyst in the present invention include acetylacetone salts, carboxylates, metallocenes, alcholates, chelate compounds, or organic metal compounds of transition elements such as magnesium, zinc, titanium, vanadium, chromium, manganese, iron, cobalt, nickel, copper, zirconium, molybdenum, ruthenium, rhodium, lanthanum, cerium, hafnium, tantalum, tungsten, and preferably magnesium, zinc, vanadium, manganese, iron, or cerium; and more preferably the acetylacetone salts or the carboxylates of magnesium, zinc, vanadium, manganese, iron, or cerium.

(c) Other Components

The heat resistant resin of the present invention may further contain fine organic filler in the range of not reducing the workability and the heat resistance of the resin. To impart a surface smoothness, the heat resistant resin may also contain, if necessary, various additives such as a smoothing agent, a leveling agent, or a defoaming agent.

The adhesive resin composition of the present invention can be used as a varnish by dissolving the polycarbodiimide resin and the bisalkenyl-substituted nadimide compound in a common solvent and further can be used as an adhesive sheet by molding the resin composition into a film by a conventional method.

The thickness of the adhesive sheet is generally from 1 to 2,000 $\mu$m but the thickness is not limited to this range and can be appropriately determined according to the adhering purpose. Also, the form and the size of the adhesive sheet can be appropriately determined according to the kind of an adherend such as lead frames, or semiconductor chips.

In forming the adhesive sheet, for the purposes of imparting an electric conductivity, improving the heat resistance, controlling the modulus of elasticity, improving the dimensional stability, and in particular, increasing the modulus of elasticity, one or more kinds of various inorganic powders composed of a metal or an alloy, such as aluminum, copper, silver, gold, nickel, chromium, lead, tin, zinc, palladium, or solder; ceramics such as alumina, silica, magnesia, or silicon nitride; or carbon can be, if necessary, compounded with the resin composition.

The coating temperature of the adhesive sheet is from 20° to 150° C., preferably from 50° to 120° C., and more preferably from 70° to 100° C. If the coating temperature is lower than 20° C., the solvent may remain in the coated film. If the coating temperature is higher than 150° C., heat setting of the coated film may proceed.

The film of the adhesive resin composition of the present invention may be formed on a support. To prepare the lamination-type adhesive sheet of the above construction, a solution of the adhesive resin composition of the present invention may be coated on a support or the lamination-type adhesive sheet may be prepared by laminating the previously formed film of the adhesive resin composition on a support by press, etc.

In this case, a metal foil, an insulating film, etc., can be used as the support. The metal foil suitably used includes a foil of aluminum, copper, silver, gold, nickel, indium, chromium, lead, tin, zinc, palladium, and iron. The foil may be a foil of the single metal or an alloy of plural metals. The insulating film which can be used is various films having a heat resistance and a chemical resistance, such as films of polyimide, a polyester, or polyethylene terephthalate.

The metal foil and the insulating film may be used alone or may be used in the form of a two-layer structure of the two elements, that is, two layer substrate of the metal foil/the insulating film may be used. The two layer substrate is, for example, a copper/polyimide two layer substrate.

The adhesive sheet of the present invention is heat-cured by a heat treatment to show a strong adhesive force, and also becomes a cured product having a low hygroscopic property. The heat treatment can be carried out by an appropriate method such as a heater, a ultrasonic wave, and ultraviolet rays.

Accordingly, the adhesive sheet of the present invention can be preferably used for the adhesive treatment of various materials, and can be particularly preferably used for the fixing treatment and the surface protection of electric and electronic parts typified by semiconductor chips, lead frames, etc., requiring a low hygroscopic property and a fixing treatment of a high reliability.

The adhesive sheet of the present invention is excellent in the points of, for example, having a low thermal expansion coefficient, being excellent in the dimensional stability to temperature change, having a low hygroscopic property, being enriched in flexibility and being easily handled, showing a good adhesive property to semiconductor elements, and having a good storage stability.

A varnish is prepared using the adhesive resin composition of the present invention, and a metal foil having an adhesive layer prepared by coating the varnish on one surface of the metal foil followed by drying is particularly useful for the production of multilayer circuit substrates, etc.

The present invention is described in more detail by reference to the following Examples and Comparative Examples. It should however be noted that the invention is not construed as being limited thereto.

The properties of each adhesive resin composition and each adhesive sheet obtained were measured as follows.

Adhesive Property

Each adhesive sheet prepared in each of the Examples and the Comparative Examples was slit into a rectangular form having a width of 10 mm was heat-adhered to a 42 alloy (an alloy comprising 42% Ni—Fe) plate under the conditions of a temperature of 200° C., a pressure of 40 kg/cm$^2$, and a time of 20 seconds. Then, the adhesive force of the adhesive sheet, which was the sample prepared, and the 42 alloy plate was measured by 180° peeling. The adhesive force was measured by Shimazu Autograph GS-100D (trade name, manufactured by SHIMAZU CORPORATION).

EXAMPLE 1

500 g of 2,4-tolylene diisocyanate was reacted in 2,000 ml of toluene in the presence of 6 g of a carbodiimidation catalyst, 3-methyl-1-phenyl-2-phosphorene-1-oxide, at 60° C. for 6 hours to obtain a polycarbodiimide solution. 25 g of N,N'-hexamethylene-bis(allylbicyclo[2,2,1]hepto-5-ene-2,3-dicarboxyimide), (BANI-H, trade name, manufactured by Maruzen Petrochemical Company, Ltd.) (hereinafter referred to as "BANI-H") was added to the solution, and the resulting mixture was uniformly mixed. The resulting solution was coated on a rough surface of an electrolytic copper foil having a thickness of 35 μm, dried by hot air at 90° C. for 30 minutes, and further dried at 150° C. for 1 hour to obtain an adhesive sheet of the present invention.

When the adhesive property of the adhesive sheet was evaluated by the method described above, the adhesive force was 1,100 g/cm. Also, the hygroscopicity of the adhesive sheet was 0.1% or lower, and when the adhesive sheet was allowed to stand at room temperature for one month, the adhesive property thereof was not lowered.

EXAMPLE 2

An adhesive sheet was prepared in the same manner as in Example 1 except that 100 g of BANI-H was used. When the adhesive property of the adhesive sheet was evaluated by the method described above, the adhesive force was 1,000 g/cm. Also, the hygroscopicity of the adhesive sheet was 0.1% or lower, and when the adhesive sheet was allowed to stand at room temperature for one month, the adhesive property thereof was not lowered.

EXAMPLE 3

An adhesive sheet was prepared in the same manner as in Example 1 except that 50 g of bis{4-(allylbicyclo[2,2,1]hepto-5-ene-2,3-dicarboxyimido)phenyl}methane (BANI-M, trade name, manufactured by Maruzen Petrochemical Company, Ltd.) (hereinafter referred to as "BANI-M") was used in place of BANI-H. When the adhesive property of the adhesive sheet was evaluated, the adhesive force was 1,200 g/cm. Also, the hygroscopicity of the adhesive sheet was 0.1% or lower, and when the adhesive sheet was allowed to stand at room temperature for one month, the adhesive property thereof was not lowered.

EXAMPLE 4

500 g of 2,2'-bis[4-(4-isocyanate phenoxy)phenyl]hexafluoropropane was reacted in 3,000 ml of tetrahydrofuran in the presence of a carbodiimidation catalyst, 3-methyl-1-phenyl-2-phosphorene, at 60° C. for 7 hours, to obtain a polycarbodiimide solution. 50 g of N,N'-p-xylylene-bis(allylbicyclo[2,2,1]hepto-5-ene-2,3-dicarboxyimide) (BANI-X, trade name, manufactured by Maruzen Petrochemical Company, Ltd.) (hereinafter referred to as "BANI-X") was added to the solution, and the resulting mixture was uniformly mixed. The resulting solution was coated on a rough surface of electrolytic copper foil having a thickness of 35 μm, dried by hot air at 90° C. for 30 minutes, and further dried at 150° C. for 1 hour to obtain an adhesive sheet of the present invention. When the adhesive property of the adhesive sheet was evaluated, the adhesive force was 1,100 g/cm. Also, the hygroscopicity of the adhesive sheet was 0.1% or lower, and when the adhesive sheet was allowed to stand at room temperature for one month, the adhesive property thereof was not lowered.

COMPATATIVE EXAMPLE 1

An adhesive sheet was prepared in the same manner as in Example 1 except that an epoxy resin (EPIKOTE 828, trade name, made by Yuka Shell Epoxy K.K.) in place of BANI-H. When the adhesive property of the adhesive sheet was evaluated, the adhesive force was 750 g/cm. Also, the hygroscopicity of the adhesive sheet was 0.5%. Furthermore, after allowing to stand the adhesive sheet at room temperature for one month, the adhesive force was similarly measured. As a result, the adhesive force was lowered to 280 g/cm, and thus the storage stability thereof was low.

COMPARATIVE EXAMPLE 2

An adhesive sheet was prepared in the same manner as in Example 1 except that BANI-H was not added. When the adhesive property of the adhesive sheet was evaluated, the adhesive force was 50 g/cm.

COMPARATIVE EXAMPLE 3

An adhesive sheet was prepared in the same manner as in Example 4 except that BANI-X was not added. When the adhesive property of the adhesive sheet was evaluated, the adhesive force was 30 g/cm.

The adhesive resin composition of the present invention and the adhesive sheet using the resin composition have a low hygroscopic property, are excellent in the storage stability, and can be stored for a long period of time at room temperature, In particular, because the adhesive resin composition and the adhesive sheet using the resin composition are excellent in the adhesive property with Ni—Fe base alloys such as a 42 alloy (42% Ni—Fe base alloy), a 45 alloy (45% Ni—Fe base alloy), or a 36 alloy (36% Ni—Fe base alloy), they have very high industrially utilizing value as microelectronics materials, semiconductor mounting martials, etc.

While the invention has been described in detail and with reference to specific embodiments thereof, it will be apparent to one skilled in the art that various changes and modifications can be made therein without departing from the spirit and scope thereof.

What is claimed is:

1. An adhesive resin composition comprising a polycarbodiimide resin represented by the following formula (1) and a bisalkenyl-substituted nadimide represented by the following formula (2):

 (1)

wherein A represents a divalent organic group and n represents a positive integer,

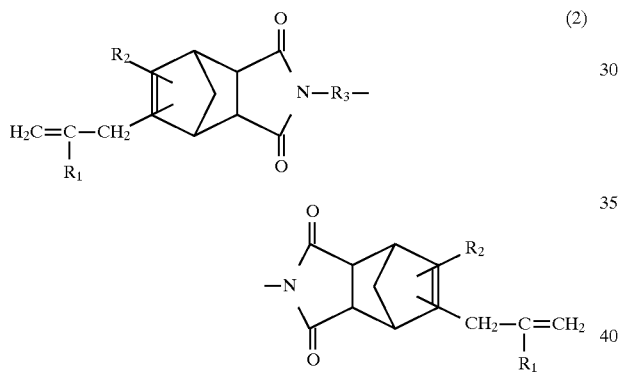 (2)

wherein $R_1$ and $R_2$ each independently represent a hydrogen atom or a methyl group and $R_3$ represents a diamine residue.

2. An adhesive resin composition as claimed in claim 1, wherein n in the formula (1) is an integer of from 2 to 200.

3. An adhesive resin composition as claimed in claim 1, wherein n in the formula (1) is an integer of from 8 to 40.

4. An adhesive resin composition as claimed in claim 1, wherein the amount of the bisalkenyl-substituted nadimide is from 1 to 100 parts by weight per 100 parts by weight of the polycarbodiimide resin.

5. An adhesive resin composition as claimed in claim 1, wherein the amount of the bisalkenyl-substituted nadimide is from 5 to 80 parts by weight per 100 parts by weight of the polycarbodiimide resin.

6. An adhesive resin composition as claimed in claim 1, which further comprises at least one kind of a curing catalyst selected from from the group consisting of an organic peroxide, an onium salt, a cationic catalyst, and an organic group-containing metal compound.

7. An adhesive resin composition as claimed in claim 6, wherein the amount of the curing catalyst is from 0.01 to 30 parts by weight per 100 parts by weight of the sum of the polycarbodiimide resin and the bisalkenyl-substituted nadimide.

8. An adhesive sheet comprising an adhesive resin composition which comprises a polycarbodiimide resin represented by the following formula (1) and a bisalkenyl-substituted nadimide represented by the following formula (2):

 (1)

wherein A represents a divalent organic group and n represents a positive integer,

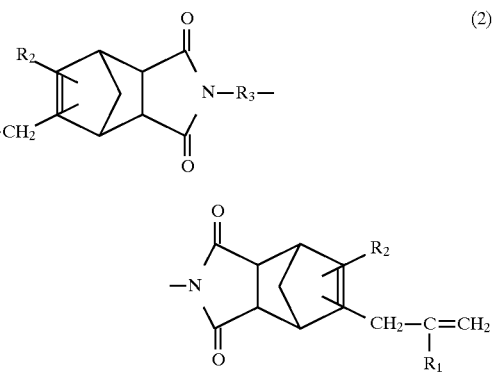 (2)

wherein $R_1$ and $R_2$ each independently represent a hydrogen atom or a methyl group and $R_3$ represents a diamine residue.

9. An adhesive sheet comprising a support having formed on at least one surface thereof an adhesive resin composition comprising a polycarbodiimide resin represented by the following formula (1) and a bisalkenyl-substituted nadimide represented by the following formula (2):

 (1)

wherein A represents a divalent organic group and n represents a positive integer,

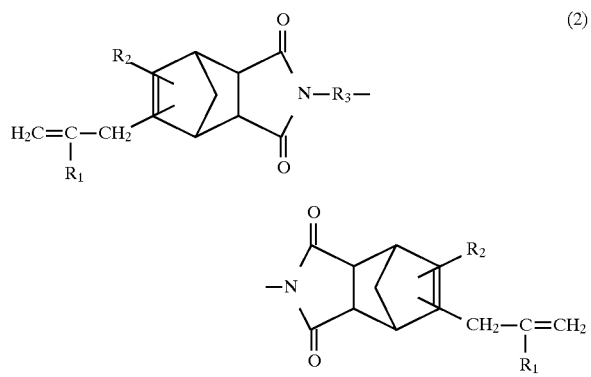 (2)

wherein $R_1$ and $R_2$ each independently represent a hydrogen atom or a methyl group and $R_3$ represents a diamine residue.

* * * * *